(12) United States Patent
Dasgupta

(10) Patent No.: US 7,786,804 B2
(45) Date of Patent: Aug. 31, 2010

(54) DRIVING AMPLIFIER CIRCUIT WITH DIGITAL CONTROL AND DC OFFSET EQUALIZATION

(75) Inventor: Uday Dasgupta, Singapore (SG)

(73) Assignee: MediaTek Singapore Pte. Ltd., Singapore (SG)

( * ) Notice: Subject to any disclaimer, the term of this patent is extended or adjusted under 35 U.S.C. 154(b) by 0 days.

(21) Appl. No.: 12/606,194

(22) Filed: Oct. 27, 2009

(65) Prior Publication Data

US 2010/0039175 A1    Feb. 18, 2010

Related U.S. Application Data

(63) Continuation-in-part of application No. 12/131,138, filed on Jun. 2, 2008, now Pat. No. 7,629,849.

(51) Int. Cl.
H03F 3/26 (2006.01)

(52) U.S. Cl. .................... 330/268; 330/267

(58) Field of Classification Search ............. 330/9, 330/263, 264, 267, 268
See application file for complete search history.

(56) References Cited

U.S. PATENT DOCUMENTS

| | | | |
|---|---|---|---|
| 4,607,233 A | | 8/1986 | Van Tuijl |
| 5,200,711 A | * | 4/1993 | Andersson et al. ......... 330/267 |
| 5,734,293 A | * | 3/1998 | Gross .......................... 327/561 |
| 5,754,078 A | | 5/1998 | Tamagawa |
| 5,841,321 A | * | 11/1998 | Miyake et al. .............. 330/255 |
| 6,369,653 B1 | | 4/2002 | Kappes |
| 6,903,610 B2 | | 6/2005 | Aoki |
| 7,629,849 B1 | * | 12/2009 | Dasgupta et al. ........... 330/268 |

OTHER PUBLICATIONS

Op't Eynde,"A CMOS Large-Swing Low-Distortion Three-Stage Class AB Power Amplifier" IEEE Journal of Solid State Circuits, vol. 25, No. 1, pp. 265-273, Feb. 1990.

* cited by examiner

*Primary Examiner*—Henry K Choe
(74) *Attorney, Agent, or Firm*—Winston Hsu

(57) ABSTRACT

A driving amplifier circuit includes: a first driver for sourcing a load current to a load; a second driver for sinking the load current from the load; a first operational amplifier (op-amp) for driving the first driver; a second operational amplifier for driving the second driver; a first bias circuit for biasing the first driver; a second bias circuit for biasing the second driver; an enabling circuit for enabling either the first bias circuit or the second bias circuit according to a control signal; a digital control circuit for monitoring currents of the first driver and the second driver to generate the control signal; and an offset equalization circuit, coupled between an internal node of the first operational amplifier and an internal node of the second operational amplifier, for adjusting DC offset of at least one of the first operational amplifier and the second operational amplifier.

22 Claims, 4 Drawing Sheets

DRIVING AMPLIFIER CIRCUIT WITH DIGITAL CONTROL AND DC OFFSET EQUALIZATION

CROSS REFERENCE TO RELATED APPLICATIONS

This is a continuation-in-part of application Ser. No. 12/131,138, which was filed on Jun. 2, 2008, and is included herein by reference.

BACKGROUND OF THE INVENTION

1. Field of the Invention

The invention relates to a driving amplifier, and more particularly, to a driving amplifier that utilizes a digital control for automatically controlling sourcing and sinking of current, and includes circuitry that balance DC offset generated due to the sinking and sourcing current control.

2. Description of the Prior Art

In amplifier design there is always a trade-off between efficiency and crossover distortion. A conventional AB current driving amplifier comprises an operational amplifier coupled to a push-pull stage, to push or pull (source or sink) a current from the load. When sourcing current to the load, a PMOS driver will be utilized, and when sinking current from the load, an NMOS driver will be utilized. Conventional AB class amplifiers utilize a small amount of biasing current to ensure a smoother crossover. If the bias current is too small the amplifier will still suffer some crossover distortion. Furthermore, if both drivers are carrying large currents then a shoot-through current from the power supply may be generated. Therefore, accurate control of the bias current is essential.

A class AB amplifier that has three stages for reducing these problems is disclosed in "*A CMOS Large-Swing Low-Distortion Three-Stage Class AB Power Amplifier*", published in the IEEE journal of solid-state circuits, Vol. 25, No. 1, February 1990, and is included herein by reference. This circuit improves on other conventional implementations, but has complicated circuitry. It is therefore desirable to provide a new operational amplifier that simplifies the circuitry of the above-described three-stage amplifier, while reducing the amount of current carried by the drivers.

SUMMARY OF THE INVENTION

This in mind, the present invention aims to provide an operational amplifier for automatically switching the drivers according to the polarity of the current present in the load.

An operational amplifier according to a first embodiment of the present invention comprises: a first driver for souring a load current to a load; a second driver for sinking the load current from the load; a first operational amplifier (op-amp) coupled to a differential input signal for driving the first driver; a second operational amplifier coupled to the differential input signal for driving the second driver; a first bias circuit for biasing the first driver; a second bias circuit for biasing the second driver; an enabling circuit, coupled to the first bias circuit and the second bias circuit, for enabling either the first bias circuit or the second bias circuit according to a control signal; and a digital control circuit, coupled to the enabling circuit, for monitoring currents of the first driver and the second driver to generate the control signal.

The present invention also provides an operational amplifier that includes circuits that can compensate for DC offset of the operational amplifiers. An operational amplifier according to a second embodiment of the present invention comprises: a first driver for sourcing a load current to a load; a second driver for sinking the load current from the load; a first operational amplifier (op-amp) coupled to a differential input signal for driving the first driver; a second operational amplifier coupled to the differential input signal for driving the second driver; a first bias circuit for biasing the first driver; a second bias circuit for biasing the second driver; an enabling circuit, coupled to the first bias circuit and the second bias circuit, for enabling either the first bias circuit or the second bias circuit according to a control signal; a digital control circuit, coupled to the enabling circuit, for monitoring currents of the first driver and the second driver to generate the control signal; and an offset equalization circuit, coupled between an internal node of the first operational amplifier and an internal node of the second operational amplifier, for adjusting DC offset of at least one of the first operational amplifier and the second operational amplifier so that the first op-amp and second op-amp have equal DC offset.

An operational amplifier according to a third embodiment of the present invention comprises: a first driver for sourcing a load current to a load; a second driver for sinking the load current from the load; a first operational amplifier (op-amp) coupled to an input signal for driving the first driver; a second operational amplifier coupled to the input signal for driving the second driver; a first bias circuit for biasing the first driver; a second bias circuit for biasing the second driver; an enabling circuit, coupled to the first bias circuit and the second bias circuit, for enabling either the first bias circuit or the second bias circuit according to a control signal; a digital control circuit, coupled to the enabling circuit, for monitoring currents of the first driver and the second driver to generate the control signal; and an external circuit, coupled to the inverting inputs of the first operational amplifier and the second operational amplifier, for adjusting DC offset of at least one of the first operational amplifier and the second operational amplifier so that the first op-amp and second op-amp have equal DC offset. The external circuit comprises: at least a tapped variable resistor coupled to a reference voltage, wherein when the tapped variable resistor is selectively tapped in different places, a DC voltage at the first operational amplifier will be different from a DC voltage at the second operational amplifier.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
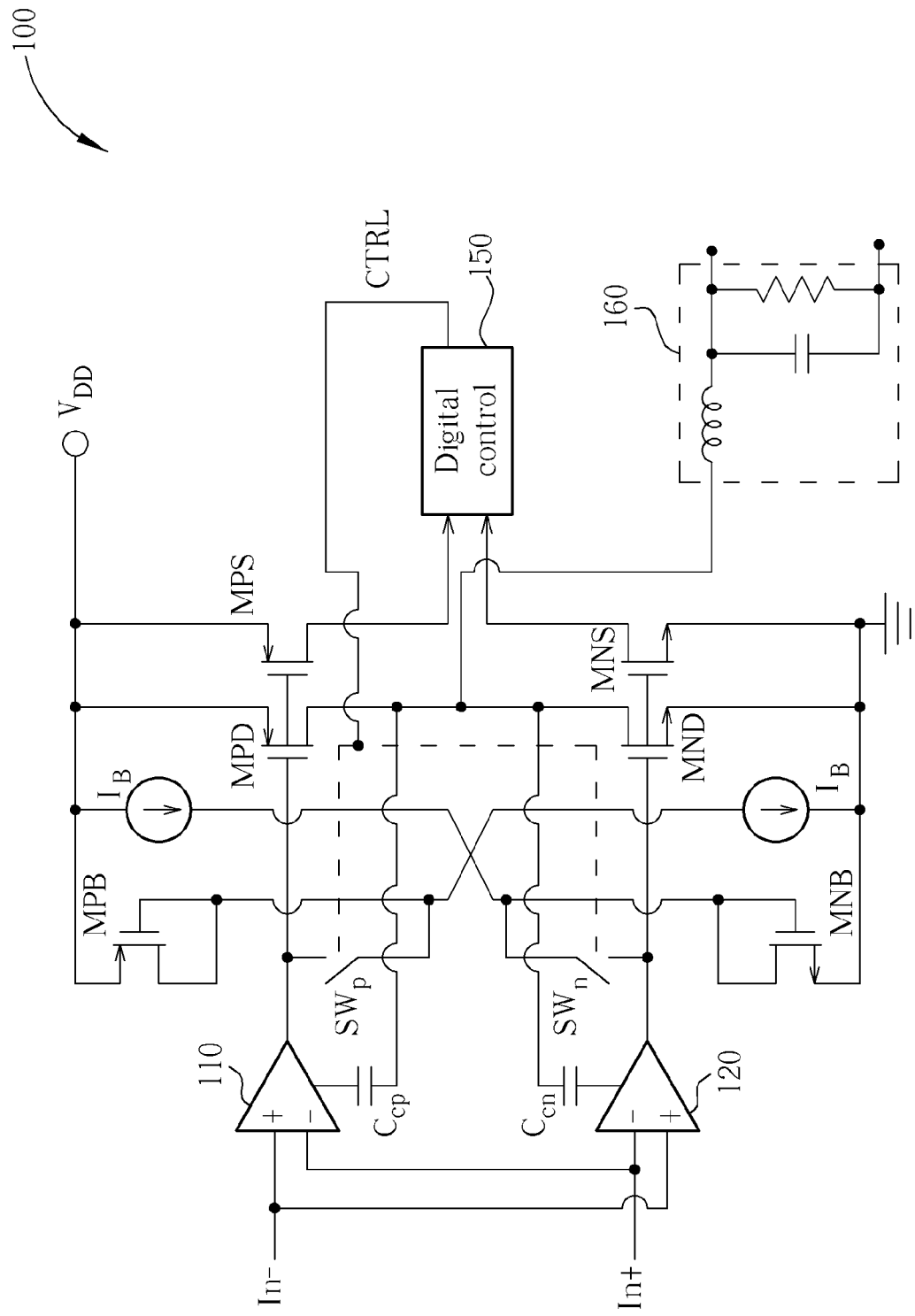
FIG. 1 is a diagram of a driving amplifier according to a first exemplary embodiment of the present invention.

Please refer to FIG. 1. FIG. 1 is a diagram of a driving amplifier 100 according to an exemplary embodiment of the present invention. The driving amplifier circuit 100 comprises a p operational amplifier 110 and an n operational amplifier 120 supplied with a differential load current. The p operational amplifier 110 and the n operational amplifier 120 are respectively coupled to a PMOS driver MPD and an NMOS driver MND. The output of the p operational amplifier 110 is further coupled to a first switch SWp, which is coupled to a bias current, and the output of the n operational amplifier 120 is further coupled to a second switch SWn, which is coupled to the bias current. The bias current is supplied by means of a P biasing transistor MPB and an N biasing transistor MNB. The outputs of MPD and MND are coupled to a digital control circuit 150 through, respectively, a first scaling transistor MPS and a second scaling transistor MNS. The output CTRL of the digital control circuit 150 is coupled to the first switch SWp and the second switch SWn. If CTRL is high, SW-p is open with SW-n closed and vice-versa if CTRL is low.

The circuit 100 utilizes the digital control circuit 150 to activate either MPD or MND through the first switch SWp and the second switch SWn. When the first switch SWp is open and the second switch SWn is closed, the p operational amplifier 110 is directly coupled to MPD for driving MPD to source current to the load 160, so MPD carries the load current IL plus the biasing current IQ, whereas MND is biased by the biasing current IQ only. Vice versa, when the first switch SWp is closed and the second switch SWn is open, the n operational amplifier 120 is directly coupled to MND for driving MND to sink current from the load 160, so MND carries a current IQ–IL, and MPD is biased by the biasing current IQ only.

When the load current becomes zero or positive, this is a sign that the circuit 100 requires sourcing and therefore the drivers will switch at this point, so that MND is biased to IQ and MPD is active. Similarly, when the load current drops to zero or becomes negative, this is a sign that the circuit 100 requires sinking and the drivers will switch again. Due to the symmetry of the circuit 100, when there is no signal input to the system, the current through both MPD and MND will be equal to IQ as there is no current in the load. In this situation, any one of MPD or MND can be active.

Figure 2:
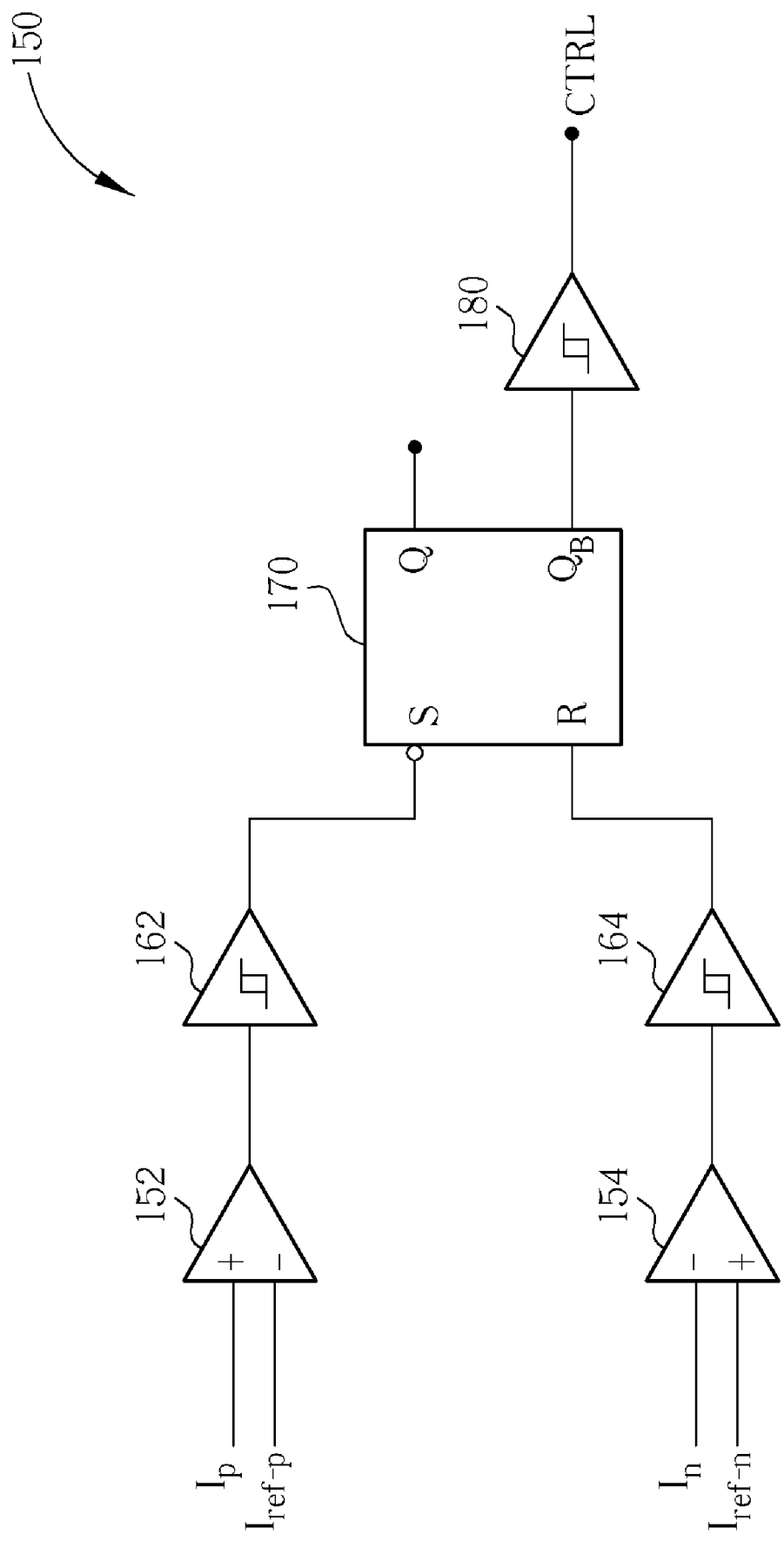
FIG. 2 is a diagram of the digital control circuit shown in FIG. 1.

Please refer to FIG. 2. FIG. 2 is a diagram showing the operation of the digital control circuit 150 shown in FIG. 1. The scaling transistors MPS and MNS carry a small scaled-down version of the currents in the drivers MPD and MND. The digital control circuit 150 consists of a first comparator 152 for comparing a current in MPS with a first reference current, and a second comparator 154 for comparing a current in MNS with a second reference current. The first comparator 152 and second comparator 154 are respectively coupled to a first Schmitt buffer 162 and a second Schmitt buffer 164, for outputting control signals according to the comparison result. These signals are input to a latch circuit 170, and set or reset the latch 170 according to the control signals. Furthermore, when no signal, and therefore, load current is present, the latch 170 will still output a control signal corresponding to a set or a reset state. The output is fed into a third Schmitt buffer 180, and then output to the switches SWp and SWn.

The operation will now be described with reference to the circuits 100 and 150 in FIG. 1 and FIG. 2. Assume that an initial stage of the circuit 100 has the switch SW-p open, and the switch SW-n closed, with the digital control signal CTRL high, so the circuit 100 is sourcing current and MND has the bias current. The current through MPD is therefore the load current plus the bias current, i.e. IQ+IL. If the load current falls to zero or below, the p comparator 152 of the digital control circuit 150 will trip and output a signal to the latch 170 indicating that the driver connection needs to be switched. The control signal CTRL will therefore go low, so MPD carries the bias current and MND carries IQ–IL, and current sinks from the load. If the load current rises again to zero or above, then comparator 154 of the digital control circuit 150 will trip and therefore reset the latch 170. This causes the control signal CTRL to go high, and MND will carry the bias current and MPD will source current. The two states described above are both stable states. Furthermore, the utilization of the Schmitt buffers can ensure that a constant signal is outputted, as the Schmitt buffers have the hysteresis function. This ensures that, even if a current is oscillating about the reference current, the digital control circuit 150 will not output a constantly changing control signal. When no load current is present, a current through MPD will equal IQ and a current through MND will equal –IQ. The control signal CTRL will therefore can be either high or low, depending on a previous state of the circuit 100. A stable state of the circuit 100 is still provided.

When the current through MND (for example) approaches zero it will effectively not be seen. But subsequently when the current in MND goes positive and the latch 170 trips the switches SWp and SWn so MPD is now sourcing current into the circuit 100, the current through MND will 'jump' back to the bias current IQ. The circuit 100 therefore provides a totally digital method of automatically switching between sourcing and sinking of current. The use of Schmitt buffers in the digital control circuit 150 allows for this digital control, and also eliminates continuous-time feedback around the digital control circuit 150. The circuitry is less complicated than in conventional implementations, and also prevents the problem of shoot-through currents. Furthermore, the digital control circuit 150 ensures that the circuit 100 is always operating in a stable state, even when no load current is present.

Under closed-loop conditions, when there is no signal input, the DC offset of the p op-amp and the n op-amp may be different. Therefore, when the control signal is high, the DC voltage appearing at the output will be different from when the control signal is low. This closed-loop DC offset needs to be equalized to avoid situations where the circuit wishes to produce a signal that just exceeds the average or analog ground threshold. To counteract this problem, driving amplifiers that employ DC offset correction according to a second embodiment and a third embodiment of the present invention, respectively, are provided.

Figure 3:
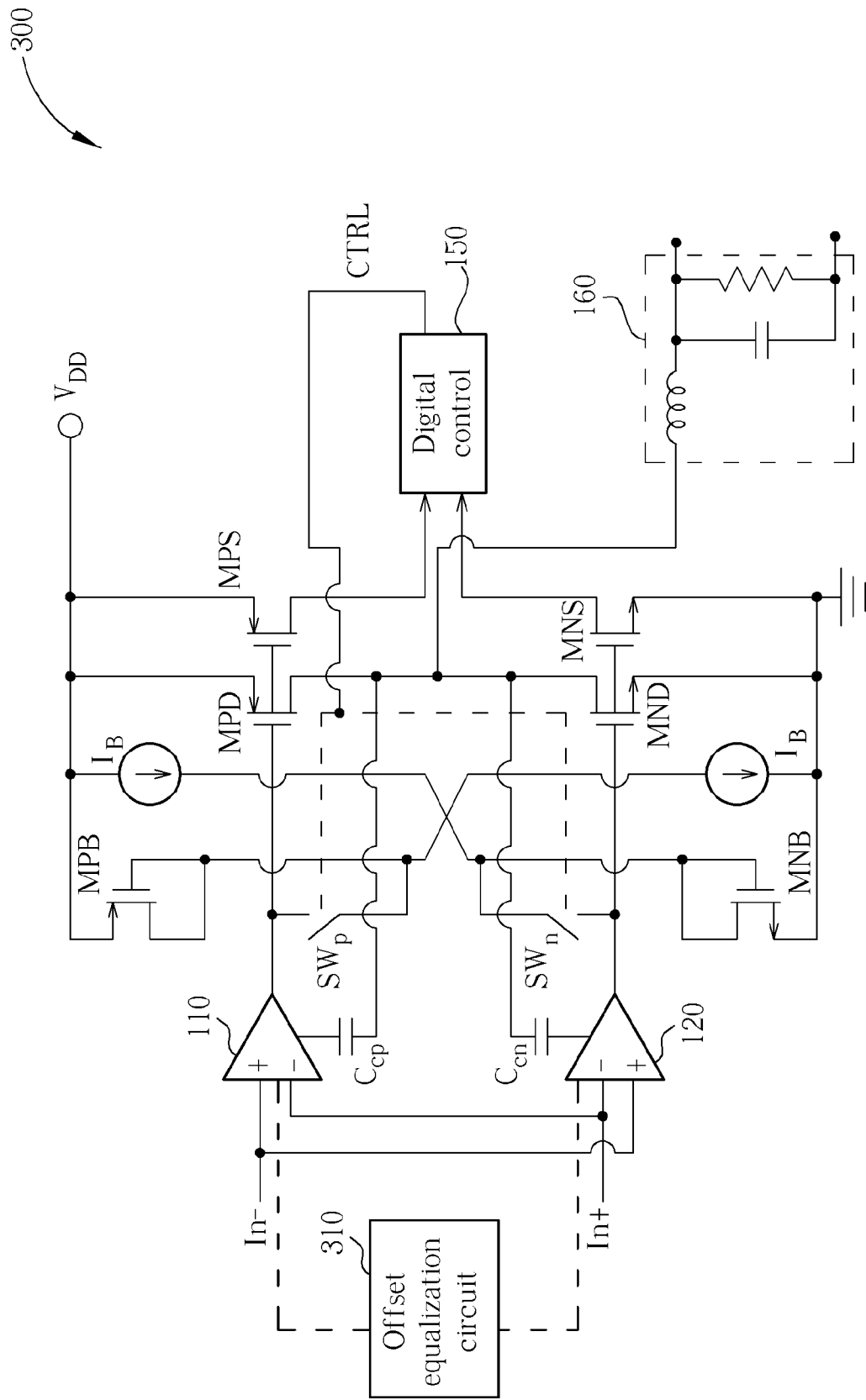
FIG. 3 is a diagram of a driving amplifier according to a second embodiment of the present invention.

Please refer to FIG. 3. FIG. 3 is a diagram of a driving amplifier 300 according to a second embodiment of the present invention. The circuit 300 is similar to that of the first embodiment, except it also includes an offset equalization circuit 310. This offset equalization circuit 300 is coupled to internal nodes of the p op-amp 110 and the n op-amp 120. The circuit can selectively adjust DC offset of one or both of the op-amps 110, 120, to ensure that both op-amps 110, 120 have equal DC offset. The offset equalization circuit 310 can be realized in a variety of ways. It may comprise a plurality of weighted current sources, or a plurality of resistors. The offset equalization circuit 310 can be calibrated through the use of control signals, or during a testing stage. One skilled in the art will appreciate that many modifications can be made to the elements that make up the offset equalization circuit without altering the offset equalization effect. The offset equalization circuit is therefore not limited to the above-described implementation, and various modifications can be made to the design without departing from the spirit of the invention.

Figure 4:
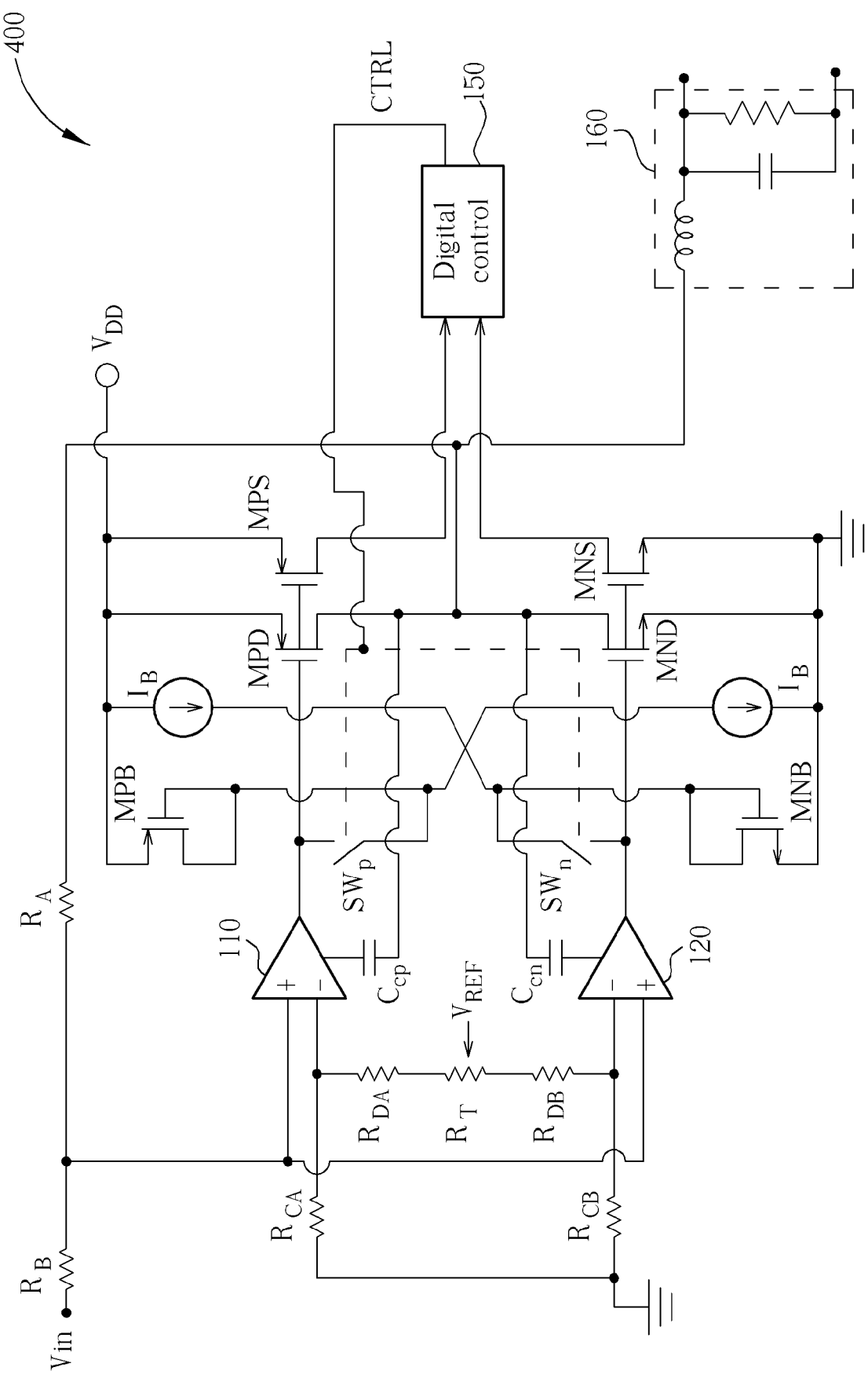
FIG. 4 is a diagram of a driving amplifier according to a third embodiment of the present invention.

The present invention also provides another circuit that can achieve the same effect but does not require calibration. Please refer to FIG. 4. FIG. 4 is a diagram of a driving amplifier 400 according to a third embodiment of the present invention. External resistors are utilized to adjust the DC offset of the p op-amp 110 and n op-amp 120. In the circuit 400, the inverting inputs of the both the p op-amp 110 and the n op-amp 120 are connected to a plurality of resistors $R_{CA}$, $R_{CB}$, $R_{DA}$, $R_{DB}$, and $R_T$. In addition, $R_{CA}$ and $R_{CB}$ are connected to ground. The A and B pairs of resistors (i.e. $R_{CA}$ and $R_{CB}$, and $R_{DA}$ and $R_{DB}$) have the same values (resistance). The resistor $R_T$ has a value much smaller than that of the other resistors. The tap of the resistor $R_T$ has a reference voltage $V_{REF}$ applied to it. The value of this reference voltage as well as the values of the other resistors is chosen such that a certain voltage (analog ground) will appear at the inverting inputs of the p op-amp 110 and the n op-amp 120 when the tap of $R_T$ is at the centre. When the tap is moved away from the centre, the DC voltages of the respective inverting inputs will be different. Therefore, if there is an existing DC offset between the two op-amps 110, 120, by moving the tap of the resistor $R_T$, this offset can be corrected for. In this way, when the control signal CTRL is switched from high to low (or vice versa), there will be no variation in voltage at the output of the circuit 400.

The present invention therefore provides automatic control of sinking and sourcing currents, and also provides means for compensating any DC offset that appears at the operational amplifiers when this automatic control occurs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A driving amplifier circuit comprising:
a first driver for sourcing a load current to a load;
a second driver for sinking the load current from the load;
a first operational amplifier (op-amp) coupled to a differential input signal for driving the first driver;
a second operational amplifier coupled to the differential input signal for driving the second driver;
a first bias circuit for biasing the first driver;
a second bias circuit for biasing the second driver;
an enabling circuit, coupled to the first bias circuit and the second bias circuit, for enabling either the first bias circuit or the second bias circuit according to a control signal;
a digital control circuit, coupled to the enabling circuit, for monitoring currents of the first driver and the second driver to generate the control signal; and
an offset equalization circuit, coupled between an internal node of the first operational amplifier and an internal node of the second operational amplifier, for adjusting DC offset of at least one of the first operational amplifier and the second operational amplifier so that the first op-amp and second op-amp have equal DC offset.

2. The driving amplifier circuit of claim 1, wherein the enabling circuit comprises:
a first switch for coupling the first driver to the first bias circuit according to the control signal; and
a second switch for coupling the second driver to the second bias circuit according to the control signal.

3. The driving amplifier circuit of claim 2, wherein when the control signal has a first logic level, the first switch is open and the second switch is closed, so the first driver is active and the second driver is biased, and when the control signal has a second logic level, the first switch is closed and the second switch is open, so the first driver is biased and the second driver is active.

4. The driving amplifier circuit of claim 1, wherein the digital control circuit compares the currents of the first driver and the second driver with respective reference currents and utilizes comparison results to generate the control signal to the enabling circuit.

5. The driving amplifier circuit of claim 4, wherein the digital control circuit comprises:
a first current comparator, for comparing the current of the first driver with a first reference current;
a second current comparator, for comparing the current of the second driver with a second reference current;
a first Schmitt buffer coupled to the first current comparator, for outputting a first trigger signal according to a comparison result of the first current comparator;
a second Schmitt buffer coupled to the second current comparator, for outputting a second trigger signal according to a comparison result of the second current comparator; and
a latch, coupled to the first Schmitt buffer and the second Schmitt buffer, for outputting the control signal according to the first trigger signal and the second trigger signal.

6. The driving amplifier circuit of claim 5, wherein the digital control circuit further comprises:
a third Schmitt buffer, coupled to the latch, for buffering the control signal.

7. The driving amplifier circuit of claim 5, wherein the first reference current has an absolute value between zero and a bias current magnitude of the biased first driver, and the second reference current has an absolute value between zero and a bias current magnitude of the biased second driver.

8. The driving amplifier circuit of claim 1, further comprising:
a first scaling circuit, coupled to the first driver, for generating a first scaled current proportional to the current of the first driver to the digital control circuit; and
a second scaling circuit, coupled to the second driver, for generating a second scaled current proportional to the current of the second driver to the digital control circuit;
wherein the digital control circuit monitors the first scaled current and the second scaled current to generate the control signal.

9. The driving amplifier circuit of claim 1, wherein the offset equalization circuit comprises a plurality of weighted current sources.

10. The driving amplifier circuit of claim 1, wherein the offset equalization circuit comprises a plurality of resistors.

11. The driving amplifier circuit of claim 1, wherein the offset equalization circuit can be calibrated.

12. A driving amplifier circuit comprising:
a first driver for sourcing a load current to a load;
a second driver for sinking the load current from the load;
a first operational amplifier (op-amp) coupled to an input signal for driving the first driver;
a second operational amplifier coupled to the input signal for driving the second driver;
a first bias circuit for biasing the first driver;
a second bias circuit for biasing the second driver;
an enabling circuit, coupled to the first bias circuit and the second bias circuit, for enabling either the first bias circuit or the second bias circuit according to a control signal;
a digital control circuit, coupled to the enabling circuit, for monitoring currents of the first driver and the second driver to generate the control signal; and
an external circuit, coupled to the inverting inputs of the first operational amplifier and the second operational amplifier, for adjusting DC offset of at least one of the first operational amplifier and the second operational amplifier so that the first op-amp and second op-amp have equal DC offset, the external circuit comprising:
  at least a tapped variable resistor coupled to a reference voltage, wherein when the tapped variable resistor is selectively tapped in different places, a DC voltage at the first operational amplifier will be different from a DC voltage at the second operational amplifier.

13. The driving amplifier circuit of claim 12, wherein the external circuit further comprises:
  a first resistor and a second resistor coupled in series with the tapped variable resistor, the first resistor being coupled to the inverting input of the first op-amp and the second resistor being coupled to the inverting input of the second op-amp; and
  a third resistor and a fourth resistor coupled in series and coupled between ground, the first resistor, and the second resistor.

14. The driving amplifier circuit of claim 13, further comprising:
  a fifth resistor and a sixth resistor coupled in series between the output of the circuit and the input voltage, for setting a closed loop gain.

15. The driving amplifier circuit of claim 13, wherein the first resistor and the second resistor have the same resistance, the third resistor and the fourth resistor have the same resistance, and the tapped variable resistor has a resistance several orders smaller than the resistance of the first resistor and the third resistor.

16. The driving amplifier circuit of claim 12, wherein the enabling circuit comprises:
  a first switch for coupling the first driver to the first bias circuit according to the control signal; and
  a second switch for coupling the second driver to the second bias circuit according to the control signal.

17. The driving amplifier circuit of claim 16, wherein when the control signal has a first logic level, the first switch is open and the second switch is closed, so the first driver is active and the second driver is biased, and when the control signal has a second logic level, the first switch is closed and the second switch is open, so the first driver is biased and the second driver is active.

18. The driving amplifier circuit of claim 12, wherein the digital control circuit compares the currents of the first driver and the second driver with respective reference currents and utilizes comparison results to generate the control signal to the enabling circuit.

19. The driving amplifier circuit of claim 18, wherein the digital control circuit comprises:
  a first current comparator, for comparing the current of the first driver with a first reference current;
  a second current comparator, for comparing the current of the second driver with a second reference current;
  a first Schmitt buffer coupled to the first current comparator, for outputting a first trigger signal according to a comparison result of the first current comparator;
  a second Schmitt buffer coupled to the second current comparator, for outputting a second trigger signal according to a comparison result of the second current comparator; and
  a latch, coupled to the first Schmitt buffer and the second Schmitt buffer, for outputting the control signal according to the first trigger signal and the second trigger signal.

20. The driving amplifier circuit of claim 19, wherein the digital control circuit further comprises:
  a third Schmitt buffer, coupled to the latch, for buffering the control signal.

21. The driving amplifier circuit of claim 19, wherein the first reference current has an absolute value between zero and a bias current magnitude of the biased first driver, and the second reference current has an absolute value between zero and a bias current magnitude of the biased second driver.

22. The driving amplifier circuit of claim 12, further comprising:
  a first scaling circuit, coupled to the first driver, for generating a first scaled current proportional to the current of the first driver to the digital control circuit; and
  a second scaling circuit, coupled to the second driver, for generating a second scaled current proportional to the current of the second driver to the digital control circuit;
  wherein the digital control circuit monitors the first scaled current and the second scaled current to generate the control signal.

* * * * *